United States Patent
DeDontney et al.

(10) Patent No.: US 6,921,437 B1
(45) Date of Patent: Jul. 26, 2005

(54) GAS DISTRIBUTION SYSTEM

(75) Inventors: Jay Brian DeDontney, Prunedale, CA (US); Jack Chihchieh Yao, Scotts Valley, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 0 days.

(21) Appl. No.: 10/854,869

(22) Filed: May 26, 2004

Related U.S. Application Data
(60) Provisional application No. 60/475,079, filed on May 30, 2003.

(51) Int. Cl.[7] .......................... C23C 16/00; C23F 1/00; H01L 21/306
(52) U.S. Cl. .................. 118/715; 118/728; 156/345.29; 156/345.33; 156/345.34; 156/345.35; 156/345.36
(58) Field of Search ............................... 118/715, 728, 118/50; 156/345.29, 345.33–345.36

(56) References Cited

U.S. PATENT DOCUMENTS

| | | | | |
|---|---|---|---|---|
| 5,010,842 A | * | 4/1991 | Oda et al. ............ 118/723 ME |
| 5,422,139 A | * | 6/1995 | Fischer .................... 427/248.1 |
| 5,453,124 A | * | 9/1995 | Moslehi et al. ............. 118/715 |
| 5,567,267 A | * | 10/1996 | Kazama et al. ........ 156/345.27 |
| 5,595,606 A | * | 1/1997 | Fujikawa et al. ........... 118/725 |
| 5,622,606 A | * | 4/1997 | Kugler et al. .......... 204/192.12 |
| 5,766,364 A | * | 6/1998 | Ishida et al. ................ 118/725 |
| 5,792,261 A | * | 8/1998 | Hama et al. ............... 118/723 I |
| 5,938,333 A | * | 8/1999 | Kearney ..................... 366/336 |
| 6,086,677 A | * | 7/2000 | Umotoy et al. ............. 118/715 |
| 6,302,964 B1 | * | 10/2001 | Umotoy et al. ............. 118/715 |
| 6,333,019 B1 | * | 12/2001 | Coppens ..................... 423/659 |
| 6,499,425 B1 | * | 12/2002 | Sandhu et al. ........... 118/723 E |
| 6,502,530 B1 | * | 1/2003 | Turlot et al. ............. 118/723 E |
| 2002/0092471 A1 | * | 7/2002 | Kang et al. ................. 118/715 |
| 2004/0050325 A1 | * | 3/2004 | Samoilov et al. ........... 118/715 |
| 2004/0050326 A1 | * | 3/2004 | Thilderkvist et al. ....... 118/715 |
| 2004/0099377 A1 | * | 5/2004 | Newton et al. ........ 156/345.33 |
| 2004/0221809 A1 | * | 11/2004 | Ohmi et al. ................. 118/715 |

* cited by examiner

*Primary Examiner*—Rudy Zervigon
(74) *Attorney, Agent, or Firm*—Dorsey & Whitney LLP (57) ABSTRACT

The present invention provides a gas distribution apparatus useful in semiconductor manufacturing. The gas distribution apparatus comprises a unitary member and a gas distribution network formed within the unitary member for uniformly delivering a gas into a process region. The gas distribution network is formed of an inlet passage extending upwardly through the upper surface of the unitary member for connecting to a gas source, a plurality of first passages converged at a junction and connected with the inlet passage at the junction, a plurality of second passages connected with the plurality of first passages, and a plurality of outlet passages connected with the plurality of second passages for delivering the gas into a processing region. The first passages extend radially and outwardly from the junction to the periphery surface of the unitary member, and the second passages are non-perpendicular to the first passages and extend outwardly from the first passages to the periphery surface. The outlet passages extend downwardly through the lower surface of the unitary member for delivering the gas into the processing region.

21 Claims, 6 Drawing Sheets

GAS DISTRIBUTION SYSTEM

CROSS REFERENCES TO RELATED APPLICATIONS

This application claims the benefit of and priority to U.S. Provisional Application No. 60/475,079 filed May 30, 2003, the disclosure of which is hereby incorporated by reference in its entirety.

FIELD OF THE INVENTION

The present invention relates generally to the field of semiconductor equipment and processing. More specifically, the present invention relates to a gas distribution apparatus useful in semiconductor fabrication.

BACKGROUND OF THE INVENTION

Wafer processing reactor systems and methods are widely used in the manufacture of semiconductors and integrated circuits. One particular type of wafer processing system utilizes chemical vapor deposition (CVD) to deposit films or layers on the surface of a substrate as a step in the manufacture of semiconductors and integrated circuits. In CVD processes that require multiple gases, the gases are generally combined within a mixing chamber. The gaseous mixture is then coupled through a conduit to a distribution plate or showerhead, which contains a plurality of holes such that the gaseous mixture is evenly distributed into a process region. As the gaseous mixture enters the process region and is infused with energy such as being heated, a chemical reaction occurs between the gases to form a film on a substrate proximate the processing region.

Although it is generally advantageous to mix gases prior to delivery into a process region to ensure that the gases are uniformly distributed into the process region, gases tend to begin reacting within the mixing chamber. Consequently, deposition or etching of the mixing chamber, conduits and other chamber components may occur prior to the gaseous mixture reaching the process region. Additionally, reaction by-products and deposits may accumulate in the chamber gas delivery components.

Some semiconductor processes require delivery of gases into a process region in a sequential manner without pre-mixing. For example, in an atomic layer deposition (ALD) process, which increasingly becomes an alternative to CVD processes, each reactant gas is independently introduced into a reaction chamber through, for example, a showerhead, so that no gas phase intermixing occurs. A monolayer of a first reactant is physi- or chemi-sorbed onto a substrate surface. After the excess first reactant is evacuated from the reaction chamber, a second reactant is then introduced through the showerhead to the reaction chamber and reacts with the first reactant to form a monolayer of the desired film via a self-limiting surface reaction. A desired film thickness is obtained by repeating the deposition cycle as necessary. It is advantageous to introduce the first and second reactants independently and separately through the showerhead to avoid any reaction between the reactants in the showerhead.

Therefore, in either a CVD or an ALD process, it is desired to maintain gases in separate passageways within a showerhead until they exit the showerhead into a process region.

To distribute process gases from a single inlet port to a multitude of outlet holes, gas distribution networks created in a showerhead body may be used. For example, a plurality of parallel channels can be formed in a unitary showerhead body from which a multitude of perpendicular outlet channels deliver process chemicals into a process region. The parallel channels are intersected perpendicularly by a single transverse plenum connected to a central gas source inlet line. Process gas passes from the inlet to the outlets of the showerhead by following a "Cartesian" path by flowing laterally along the transverse plenum, transverse through the parallel channels, and the outlet channels into the process region.

A disadvantage of this design is that there is a large variation in total flow path to reach points of constant radius within the showerhead. As a result, there is typical a large variation in backpressure within the interior flow channels that result in an unacceptable azimuthal and radial variation in outlet gas flow velocity from the multitude of outlet holes. Furthermore, in showerhead designs with a single central gas inlet, there exists an unavoidable time lag between the gases that exist near the center of the showerhead and those existing at the outer perimeter. The large variation in total flow path at points of constant radius inherent with Cartesian-style flow networks creates a "phase error" that may lead to non-uniform chemical concentrations around the perimeter of the showerhead which may affect deposition in transient-flow processes.

To minimize the azimuthal variation in time-lag, radially oriented channels that converge at the center gas inlet may be employed instead of a multitude of parallel channels. However, this type of design leads to a decreasing outlet hole density (hole per square centimeter) due to the divergence of the radial passages. This may be compensated somewhat by additional radial passages at larger radii, however, these require cross-connection to the same source of gas which becomes difficult to do in a truly unit body block of material. Furthermore, it is not apparent that this will yield acceptable flow uniformity either.

Therefore, there is a need of a gas distribution system that provides improved uniform outlet velocity distribution and reduced variation in azimuthal time lag between the gases that exit near the center of the showerhead and those existing at the outer perimeter. Further developments in gas distribution apparatus useful in CVD and ALD processes are needed.

SUMMARY OF THE INVENTION

A gas distribution apparatus useful in semiconductor fabrication is provided. The gas distribution apparatus promotes uniformly delivery of gases into a process region and reduces azimuthal variation in time lag between gas that exits near the center and gas exiting at the outer perimeter of the apparatus.

In one embodiment, the present gas distribution apparatus comprises a member and a gas distribution network formed within the unitary member for uniformly delivering a gas into a process region. The member can be a unitary member. The gas distribution network is formed of an inlet passage extending upwardly through the upper surface of the unitary member for connecting to a gas source. A plurality of first passages converge at a junction and interconnect with the inlet passage at the junction. A plurality of second passages are connected with the plurality of first passages, and a plurality of outlet passages are connected with the plurality of second passages for delivering the gas into a processing region. The first passages extend radially and outwardly from the junction to the periphery surface of the unitary member. The second passages are non-perpendicular to the first passages and extend outwardly from the first passages to the periphery surface. The outlet passages extend downwardly through the lower surface of the unitary member for delivering the gas into the processing region.

In one embodiment, the first passages are comprised of four orthogonal coordinate passages dividing the gas distribution network into four regions or quadrants. The second passages in each of the quadrants are parallel with each other. In opposite two quadrants, the first and second passages are symmetrically arranged. In adjacent two quadrants, the second passages on both sides of a common first passage are staggeredly arranged. The first and second passages constitute an angle from about 30 to about 45. In one embodiment, the angle is about 45 degrees.

In another embodiment, the first passages are comprised of six passages, and adjacent two passages form an angle of about 60 degrees.

Generally, the first passages have a diameter larger than the diameter of the second passages. The second passages have a diameter larger than the diameter of the outlet passages. In one embodiment, the diameter of the first passages is in the range from about 5 to about 15 mm, the diameter of the second passages is in the range from about 3 to about 12 mm, and the outlet diameter is in the range from about 0.25 to about 2.5 mm.

In another embodiment, the outlet passages are substantially cylindrical and adapted to receive inserts to alter the size of and/or direction of gases exiting the outlets into a process region. In a further embodiment, the outlet passages are provided with threads for receiving the inserts.

In one embodiment, the present gas distribution system comprises a unitary cylindrical member and two independent gas distribution networks formed within the unitary member. Each of the gas distribution networks is formed of an inlet passage extending upwardly through the upper surface of the unitary member for connecting to a gas source, a plurality of co-planar first passages converged at a junction add interconnected with the inlet passage at the junction, a plurality of second passages connected with the plurality of first passages, and a plurality of outlet passages connected with the plurality of second passages and extending downwardly through the lower surface of the unitary member for delivering the gas into the processing region. The first passages extend radially and outwardly from the junction to the periphery surface of the unitary member. The second passages are co-planar with and non-perpendicular to the first passages and extend outwardly from the first passages to the periphery surface. The first and second passages of each of the gas distribution networks are formed at different elevations within the unitary member and the inlet passages of each of the gas distribution networks offset each other. The two independent gas distribution networks are not in fluid communication within the unitary member. In one embodiment, the first passages of each of the gas distribution networks are comprised of four orthogonal coordinate passages. In another embodiment, the outlet passages of each of the two gas distribution networks extend through the lower surface in an alternate and even configuration. In a further embodiment, the two gas distribution networks have substantially the same dimensions and configurations.

In one embedment, the present gas distribution system comprises a unitary cylindrical member having an upper surface, a lower surface and a periphery surface, and three independent gas distribution networks formed within the unitary member. Each of the gas distribution networks is formed of an inlet passage, a plurality of first passages, a plurality of second passages connected with the first passages, and a plurality of outlet passages connected with the second passages. The inlet passage extends upwardly through the upper surface for connecting to a gas source. The first passages converge at a junction and is interconnected with the inlet passage at the junction. The first passages extend radially and outwardly from the junction to the periphery surface. The second passages are co-planar with and non-perpendicular to the first passages and extend outwardly from the first passages to the periphery surface. The outlet passages are connected with the second passages and extend downwardly through the lower surface for delivering the gas into the processing region. The first and second passages of each of the three gas distribution networks are formed at different elevations within the unitary member and the inlet passages of each of the three gas distribution networks offset each other. The three independent gas distribution networks are not in fluid communication within the unitary member. In one embodiment, the first passages of each of the three gas distribution networks are comprised of six passages, and adjacent two passages form an angle of about 60 degrees. The three gas distribution networks may have substantially the same dimensions and configurations.

BRIEF DESCRIPTION OF THE DRAWING

Other objects and advantages of the present invention become apparent upon reading of the detailed description of the invention provided below and upon reference to the drawings in which.

DETAILED DESCRIPTION OF THE INVENTION

A gas distribution apparatus useful in semiconductor fabrication is provided. In general, the gas distribution apparatus of the present invention comprises a unitary member and one or more gas distribution networks formed within the unitary member for uniformly delivering gases into a process region.

Referring to the drawings where like components are designated by like reference numerals, the present gas distribution apparatus is described in more detail.

Figure 1:
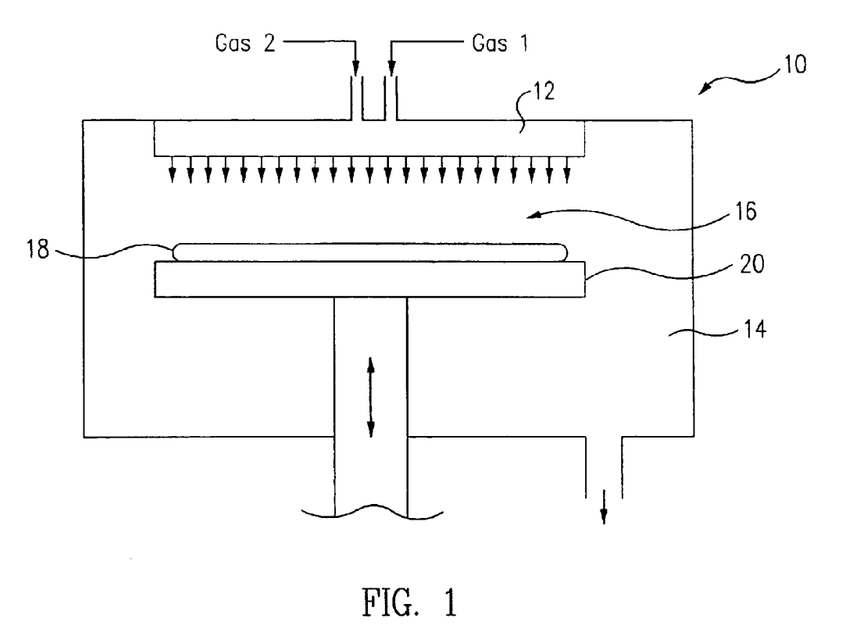
FIG. 1 is a schematic view of a semiconductor reactor system including a gas distribution apparatus in accordance with one embodiment of the present invention.

FIG. 1 schematically shows a semiconductor wafer processing reaction chamber 10, for example, an atomic layer deposition (ALD) reactor or a CVD reactor that includes a showerhead 12 of the present invention. It should be noted that the reactor 10 shown in FIG. 1 is for illustrative purpose only and not intended to limit the scope of the invention in any way. The showerhead described below can be used in any other system where uniform gas distribution into a process region is desired. The reactor 10 includes an enclosure 14 defining a processing region 16. A substrate 18, such as a semiconductor wafer, is maintained proximate the process region 16 on a pedestal 20. The pedestal 20 moves vertically within the enclosure 14 to a position that allows the substrate 18 to be removed. While in the lowered position, a new substrate 18 is placed on the pedestal 20. The pedestal 20 is then raised into a process position, which places the substrate proximate the process region 16. Process gases are supplied through the showerhead 12. The showerhead 12 forms a lid of the reactor 10. In one embodiment of the present invention, for example, in a CVD process, two gases (Gas 1 and 2) are independently and separately supplied to the showerhead 12. The two gases are distributed to the process region 16 via two separate gas distribution networks 21 formed in the showerhead 12. These gases react and form a deposit on the substrate 18. In another embodiment of the present invention, for example, in an ALD process, a first reactant gas (Gas 1) is introduced into the process region 16 via a gas distribution network formed within the showerhead 12. After a monolayer of a first reactant gas is physi- or chemi-sorbed onto the substrate surface, the excess first reactant gas is evacuated from the reaction chamber 10 with the aid of an inert purge gas. A second reactant (Gas 2) is then introduced to the process region 16 via a separate gas distribution network formed within the showerhead. The second reactant gas reacts with the first reactant forming a monolayer of the desired film via a self-limiting surface reaction. The excess second reactant is then evacuated with the aid of an inert purge gas. A desired film thickness is obtained by repeating the deposition cycle as necessary.

Figure 2:
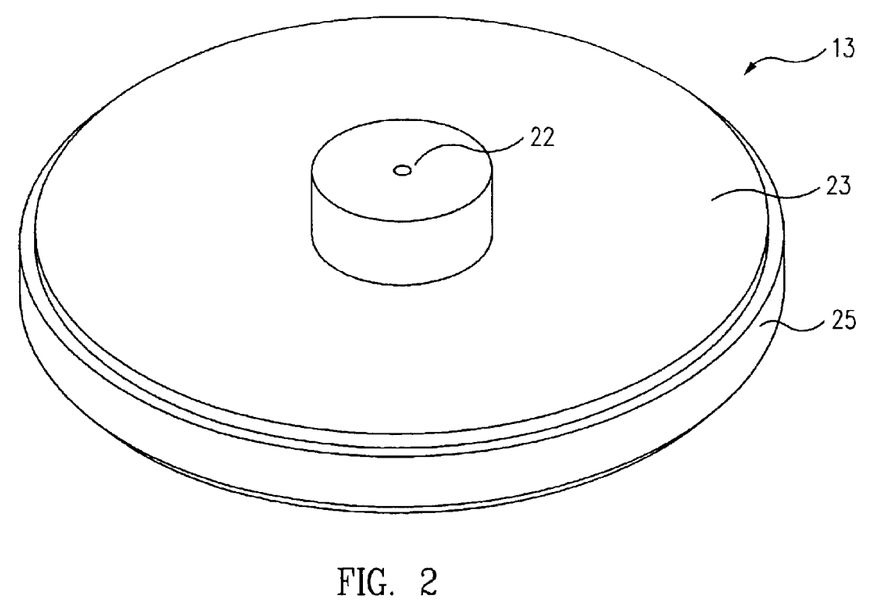
FIG. 2 is an external view of a gas distribution apparatus machined from a unitary member in accordance with one embodiment of the present invention.
Figure 3:
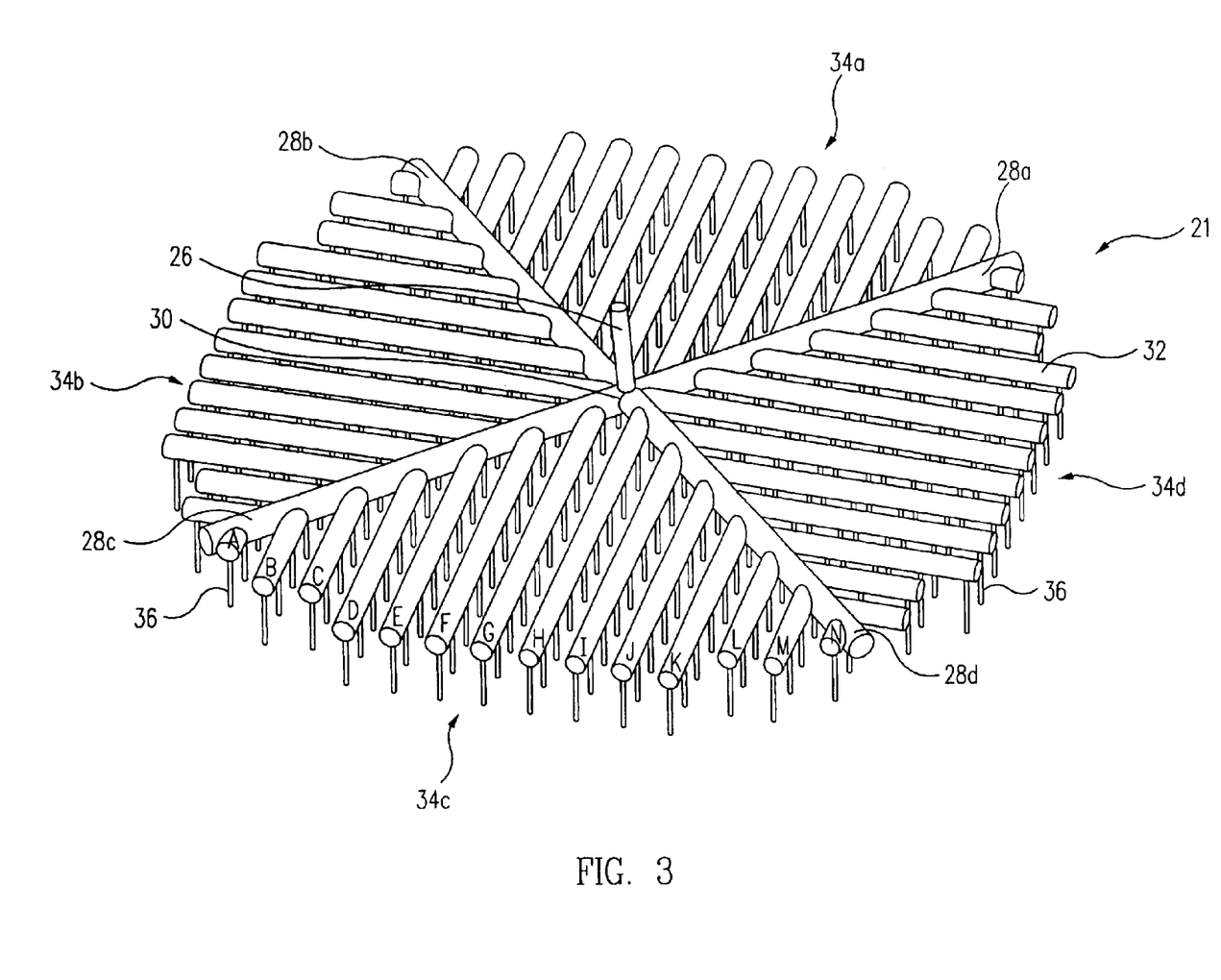
FIG. 3 shows an internal gas distribution network formed within a unitary member in accordance with one embodiment of the present invention.

The showerhead 12 is preferably a unitary member 13, as shown in FIG. 2, and has one or more gas distribution networks 21, as shown in FIG. 3, formed within the unitary member 13. Member 13 can also be two or more blocks combined together. To simplify description of the invention, a single gas port 22 and a single gas distribution network 21 are shown in FIGS. 2 and 3. It should be noted that two or three gas distribution networks 21 can be independently formed at different elevations within the unitary member 13, and two or three gas ports 22 can be provided to independently and separately supply gases into the two or three gas distribution networks 21. The two or three gas distribution networks 21 are not interconnected within the unitary member 13 so that two or three gases are independently and separately introduced into a process region 16 without premixing. In one embodiment where two or three gas distribution networks 21 are formed within the unitary member 13, two or three gases can be simultaneously supplied into the showerhead 12 from separate gas sources (not shown). Since the two or three gas distribution networks 21 are not in fluid communication with each other within the unitary member 13, the two or three gases are not mixed until they exit the showerhead 12 into the process region 16. Alternatively, two or three gases are supplied into the process region 16 sequentially via the two or three gas distribution networks 21 within the unitary member 13 to meet specific process requirements, for example, in an atomic layer deposition process.

Member 13 is preferably machined from a block of aluminum, stainless steel, nickel-based alloys, or any material that does not react with the particular gases being supplied into the showerhead 12. The unitary member 13 can be in a cylindrical shape or any shape suitable as a lid for the reactor 10. The unitary member 13 comprises an upper surface 23, a lower surface 24, and a peripheral surface 25. A plurality of channels, passages or holes are formed within the unitary member 13 to form a gas distribution network 21. Various manufacturing techniques known in the art can be used to form the channels, passages or holes, such as electric discharge drilling, mechanical drilling, pressurized reactant drilling, water jet cutting, and the like. In one embodiment, these channels or passages are formed by mechanical drilling and/or an electrode discharge machine (EDM).

FIG. 3 shows a gas distribution network 21 formed within the unitary member 13. For clarity, only channels, passages, or holes forming the gas distribution network 21 are shown in FIG. 3. The remaining solid materials that define these channels, passages or holes of the gas distribution network 21 are not shown in FIG. 3.

As illustrated in FIG. 3, the gas distribution network 21 comprises an inlet passage 26. The inlet passage 26 is coupled to a gas source (not shown) via a conduit (not shown) for supplying a gas into the gas distribution network 21. The inlet 26 extends upwardly and through the upper surface 23.

A plurality of horizontal passages or plenums 28a–d are formed within the unitary member 13. The horizontal plenums 28a–d are converged at a junction 30 and extend radially and outwardly to the peripheral surface 25 of the unitary member 13. The horizontal plenums 28a–d are closed at the peripheral surface 25. The horizontal plenums 28a–d can be formed by drilling from the peripheral surface 25. The openings on the peripheral surface 25 are closed by for example sealing plugs (not shown) after the plenums 28a–d are formed. The inlet passage 26 is connected with the plenums 28a–d via the junction 30. In FIG. 3, four orthogonal coordinate plenums 28a–d are shown for illustrative purpose. It should be noted that other number of plenums can be formed. For example, six plenums can be formed converging at a junction, and adjacent two plenums constitute an angle of 60 degrees. A gas is introduced via the inlet passage 26 and distributed into the horizontal plenums 28a–d.

A plurality of branch passages or tributaries 32 are formed along the path of each of the horizontal plenums 28a–d. The tributaries 32 extend from the plenum 28 to the peripheral surface 25 of the unitary member 13. The tributaries 32 are closed at the peripheral surface 25. These branch passages or tributaries 32 are formed at a same elevation with the plenums 28. In one embodiment, such as shown in FIG. 3, the gas distribution network 21 is divided into four regions or quadrants 34a–d by four orthogonal coordinate plenums 28a–d. An array of parallel tributaries 32 are formed in each of the quadrants 34a–d. The length of each of individual tributary 32 is determined to define a desired gas distribution configuration. In one embodiment where a substantially circular distribution configuration is desired, each individual tributary 32 extends outwardly and closed at a location that is substantially equally distant from the peripheral surface 25 of the cylindrical member 13. Other distribution configurations such as a square pattern can be defined by varying the length of the plenums 28a–d, tributaries 32, and outlets 36 described below.

In opposite two quadrants such as 34a and 34c, or 34b and 34d, the configuration of tributaries 32 are symmetrical. In adjacent two quadrants such as 34a and 34b, or 34a and 34c, the tributaries 32 formed along a common plenum such as 28a or 28b are staggered and angled from the plenum. In one embodiment, each tributary 32 forms an acute angle with the plenum 28 of about 45 degrees. This angle can be determined by the geometrical requirements imposed by the number of gas distribution networks and the desired outlet hole patterns.

Figure 4:
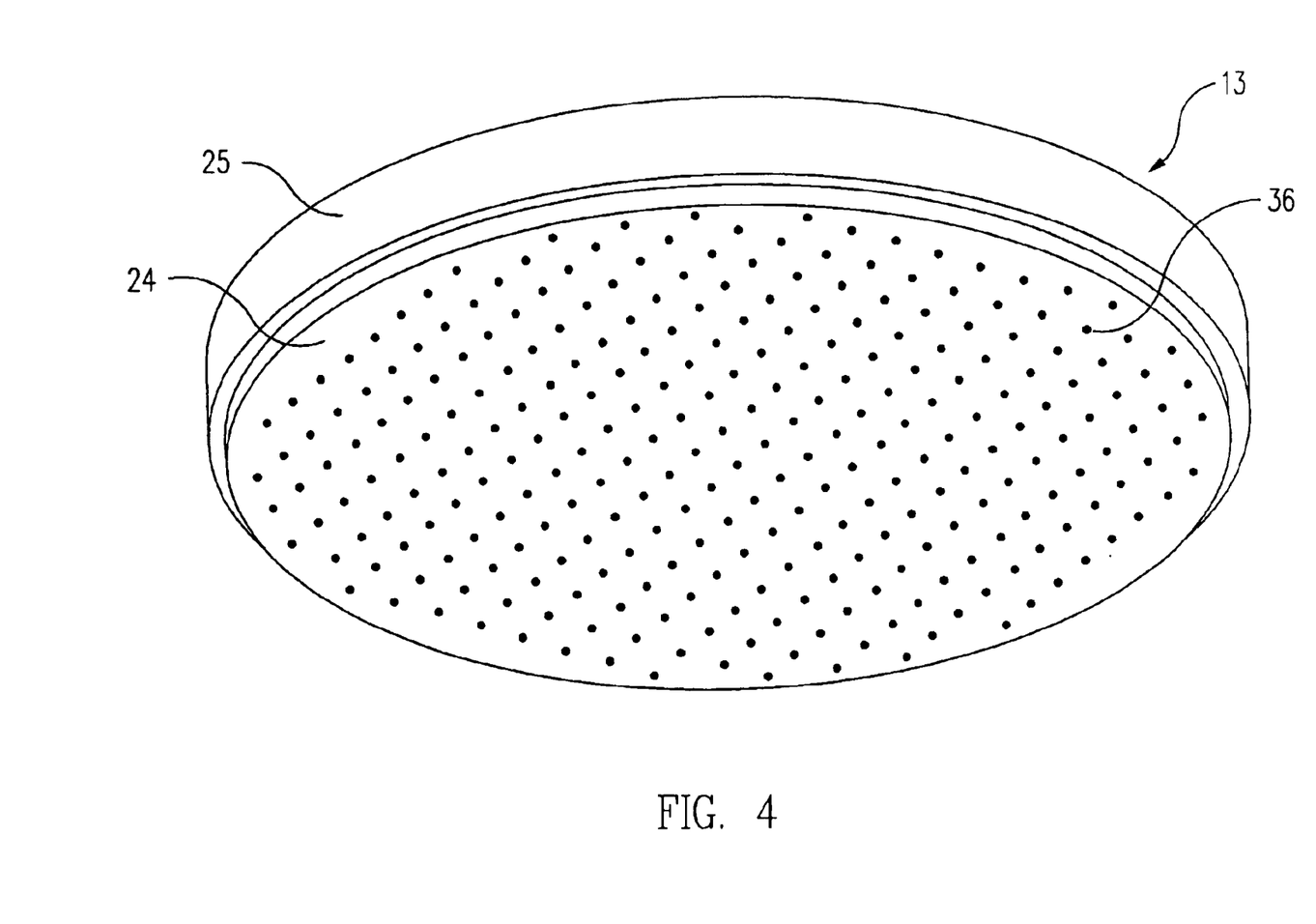
FIG. 4 is an external view of a gas distribution apparatus showing outlet passages through the bottom surface of a unitary member in accordance with one embodiment of the invention.

Along the path of each of the tributaries 32, an array of passages or outlets 36 are formed for distributing gases into a process region 16. The outlets 36 extends downwardly and through the lower surface 24 of the unitary member 13 as shown in FIG. 4. The passages of the outlets 36 can be straight and cylindrical. Alternatively, the passages of the outlets 36 comprise a first portion proximate the tributary 32 and a second portion distant the tributary 32. The first portion of the outlet passage may have a larger or smaller diameter than that of the second portion to control the back pressure of the outlets 36 according to process requirements. The outlet passages may also be provided with threads for receiving inserts that are designed to alter the size of the outlet or direction of gases exiting the outlet into the process region. U.S. application Ser. No. 10/856,584 entitled "Adjustable Gas Distribution System" filed concurrently with this application discloses embodiments of inserts that can be used in the present gas distribution system, the disclosure of which is hereby incorporated by reference in its entirety.

The diameters of the plenums 28a–d, tributaries 32, and outlets 36 are selected to provide a desired outlet velocity. In one embodiment, the diameters of the plenums 28a–d are larger than those of the tributaries 32, and the diameters of the tributaries 32 are larger than those of the outlets 36. Small outlet diameters create resistance to gas flow so as to sustain smaller variation in back pressure among all of the outlets. Large plenum and tributary diameters assist in this effect which is desirable. Typically, if the backing pressure is uniform among all the outlets, the outlet velocities are also uniform. However, it is desirable not to make the outlets too small as this may lead to "jetting" of gases, which is undesirable in semiconductor processes. The diameters of the outlets 36 can be uniform throughout the entire distribution region. Alternatively, the diameters of the outlets 32 differ to provide an inner region with a larger diameters and an outer region with smaller diameters.

In one embodiment, the diameter of the plenums 28a–d is selected in the range from about 5 mm to about 15 mm, the diameter of the tributaries 32 in the range from about 3 mm to about 12 mm, and the diameter of the outlets 36 in the range from about 0.25 mm to about 2.5 mm. In another embodiment, the diameter of the plenums 28a–d is selected in the range from about 9 mm to about 12 mm, the diameter of the tributaries 32 in the range from about 6 mm to about 9 mm, and the diameter of the outlets 36 in the range from about 1 mm to about 1.5 mm.

For clarity and simplicity, only some tributaries, outlets and plenums are shown in FIG. 3 for illustrative purpose. It should be noted that numerous tributaries and outlets can be formed to provide desired outlet density for specific processes. For example, the number of plenums, tributaries and outlets are selected to provide an outlet density of about 1 hole per 2 square centimeters. Table 1 summarizes the modeling results for the present gas distribution system as analyzed in computational fluid dynamics (CFD) simulations.

TABLE 1

| Design No. | Plenum Diameter (mm) | Tributary Diameter (mm) | Outlet Diameter (mm) | Range/Average | Max/Min |
|---|---|---|---|---|---|
| 1 | 10.0 | 8.0 | 1.5 | 0.131 | 1.138 |
| 2 | 10.0 | 8.0 | 1.5 | 0.133 | 1.140 |
| 3 | 8.0 | 8.0 | 1.5 | 0.203 | 1.220 |
| 4 | 9.0 | 6.0 | 1.5 | 0.268 | 1.287 |
| 5 | 8.0 | 8.0 | 1.5 | 0.290 | 1.328 |
| 6 | 10.0 | 6.0 | 1.5 | 0.337 | 1.364 |

In Table 1, Max/Min refers to the ratio of maximum to minimum outlet velocity. Range/Average refers to the ratio of Max/Min value to the average gas flow velocity. The values of Max/Min and Range/Average are used to rank the performance of the gas distribution systems. Small values of Max/Min and Range/Average are desired for uniform distribution of gases into a process region.

Table 1 demonstrates a much better performance of the present gas distribution apparatus over prior art showerheads. In a prior art showerhead of the Cartesian style network type, the Max/Min ratio was tested and found to be 3.584, which means that the variation of the outlet velocity is as high as more than 350%, and the Range/Average was 150,or 150%. In comparison, the Max/Min ratios for the gas distribution system of the present invention range only from 1.220 to 1.364, and the Range/Average ratios range only from 0.131 to 0.337.

Figure 5:
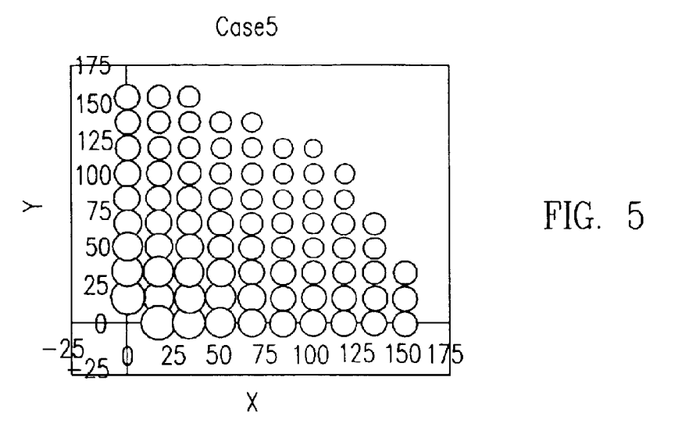
FIG. 5 is a bubble plot showing outlet velocities in the geometry of a prior art showerhead.
Figure 6:
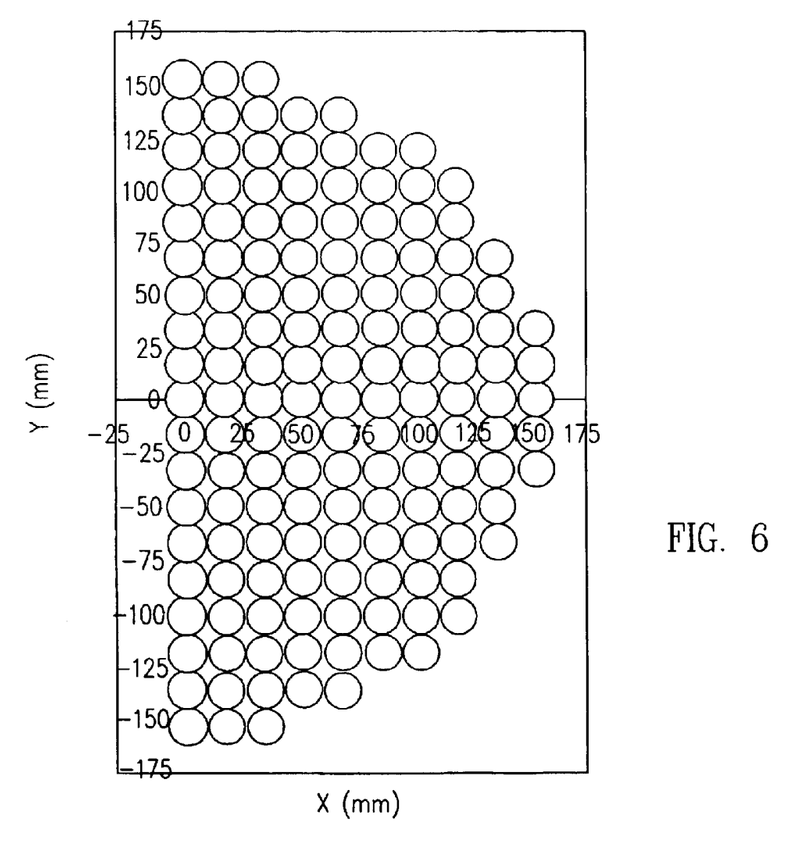
FIG. 6 is a bubble plot showing outlet velocities in the geometry of a gas distribution apparatus in accordance with one embodiment of the present invention.

FIG. 5 is a bubble plot that shows the outlet velocities in the geometry of a prior art showerhead. FIG. 6 is a bubble plot that shows the outlet velocities in the geometry of the present gas distribution system as defined by design 5 in Table 1. As shown in FIG. 5, the bubbles in the outer perimeter regions are obviously smaller than those in the inner region. In words, the flow velocities in the inner region are greater than those in the outer perimeter region. FIG. 6 shows an improvement of the flow velocity provided by the gas distribution system of the present invention. FIG. 6 demonstrates a substantially uniform outlet velocities regardless of the distance from the center region.

Figure 7:
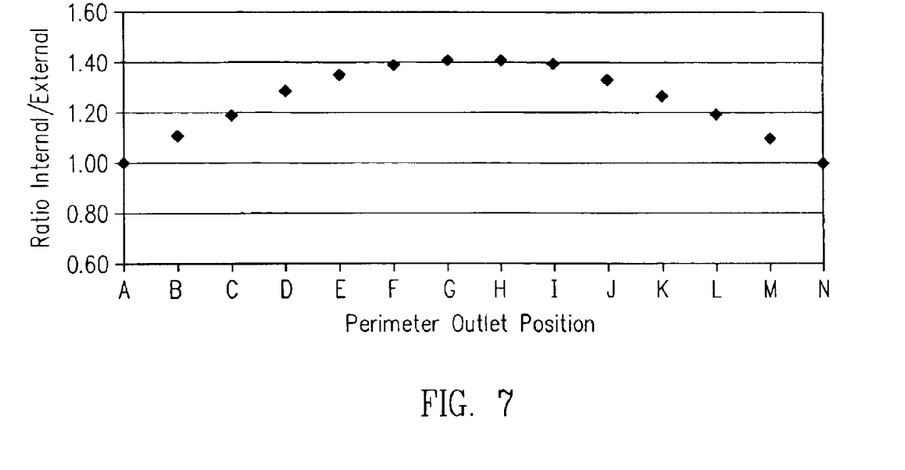
FIG. 7 is a plot showing internal and external path length ratios in a prior art showerhead.
Figure 8:
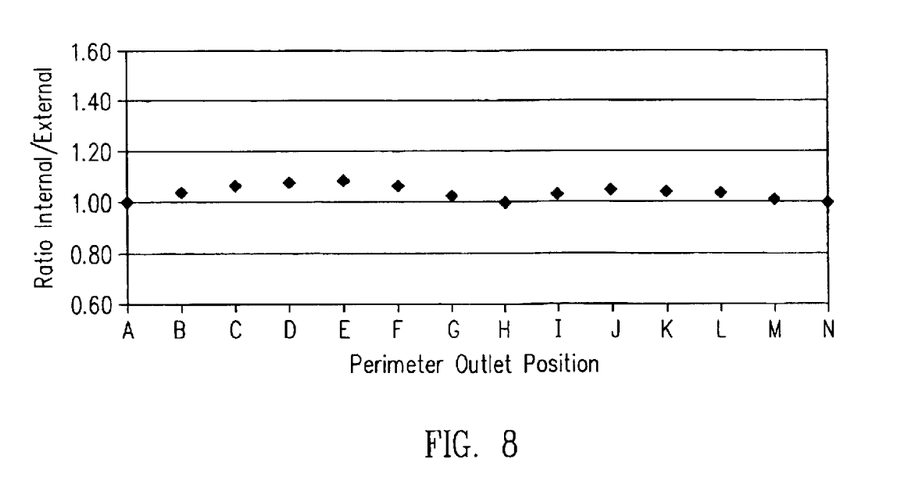
FIG. 8 is a plot showing internal and external path length ratios in a gas distribution apparatus in accordance with one embodiment of the present invention.

One advantage of the present gas distribution system is a smaller transit time variation in the polar directions over that of the prior art showerhead design. FIGS. 7 and 8 compare the internal and external path length in the present gas distribution system and prior art showerhead. In FIGS. 7 and 8, x-axis represents outlet perimeter positions, and y-axis represents the length ratio of an internal path for a gas traveling to an outlet at the outer parameter and an external path that the gas would travel from the center junction radially and outwardly towards that same outlet. In the present gas distribution system illustrated in FIG. 3, the internal/external path ratio at perimeter positions G and H is close to 1 due to the radial design, as shown in FIG. 8. In a prior art showerhead, the internal/external path ratio at a equivalent perimeter positions can be as high as 1.4, as shown in FIG. 7. FIGS. 7 and 8 demonstrate that the present gas distribution system greatly reduces the azimuthal variation in time lag between gases that exit near the center of the showerhead and those exiting at the outer perimeter. This in turn enhances gas distribution uniformity into a process region, which is desirable in semiconductor manufacturing.

Figure 9:
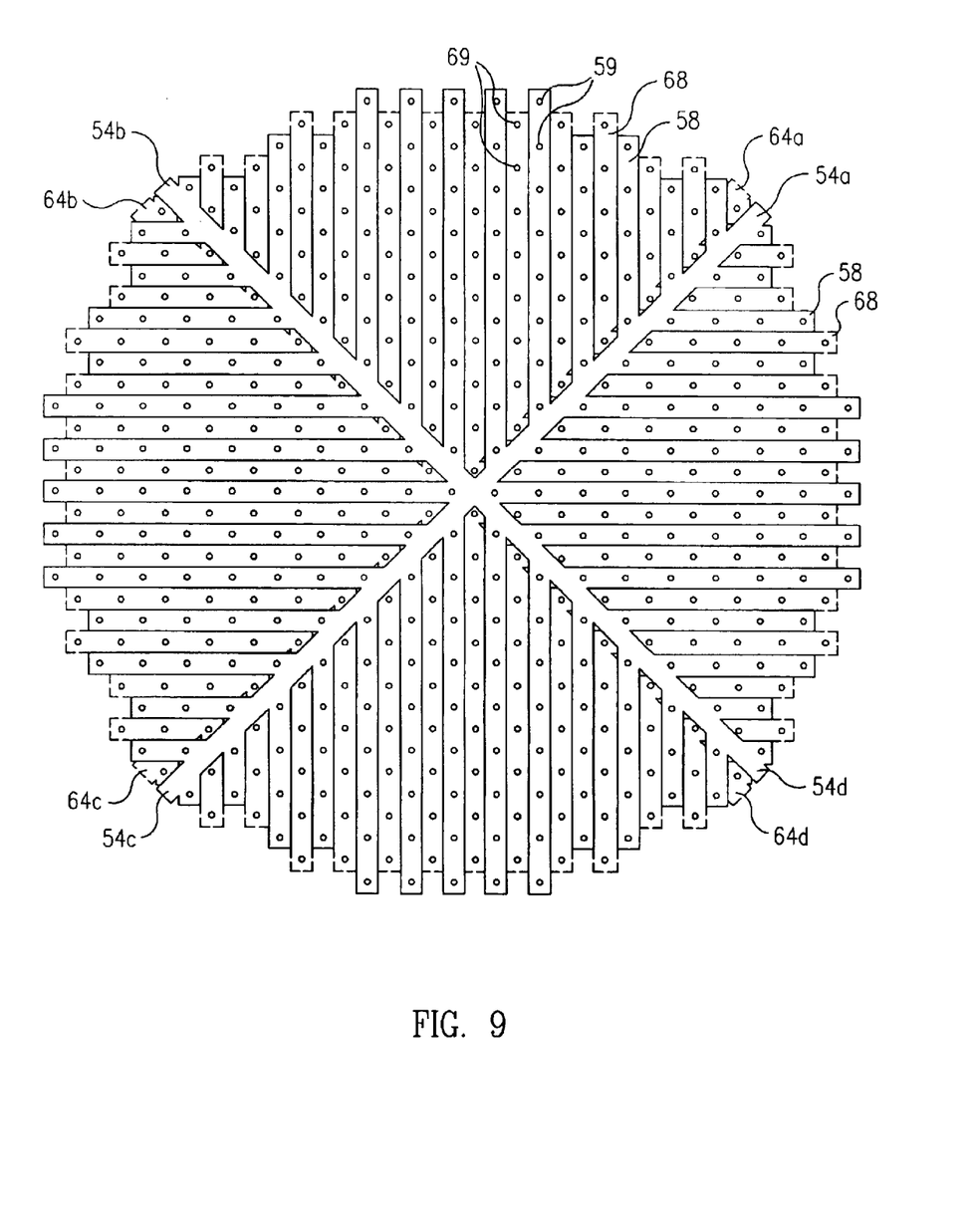
FIG. 9 shows two internal gas distribution networks formed within a unitary member in accordance with one embodiment of the present invention.

In one embodiment, two internal gas distribution networks are formed at different elevations within a unitary member to independently and separately supply two gases into a process region. Each of the two internal gas distribution networks is described above with reference to FIGS. 2–8. The two internal gas distribution networks are not in fluid communication within the unitary member. The configuration of the two internal gas distribution networks can be substantially the same. In one embodiment as shown in FIG. 9, each of the two internal gas distribution networks is divided into four regions or quadrants by four orthogonal coordinate main passages or plenums 54*a–d* and 64*a–d*. The four plenums converge at a junction and extend radially and outwardly to the peripheral surface of the unitary member. A plurality of parallel branch passages or tributaries 58 and 68 are formed in each of the quadrants. The tributaries 58 and 68 are coupled to the plenums 54*a–d* and 64*a–d* respectively and extend outwardly to the peripheral surface of the unitary member. The tributaries and the plenum connected therewith constitute an angle about 45 degrees. An inlet passage is formed and coupled to the junction of the plenums. The inlet passage extends upwardly and through the upper surface of the unitary member to couple to a gas source via a conduit. A plurality of vertical outlet passages 59 and 69 are formed along the path of each of the tributaries 58 and 68 respectively. The outlet passages 59 and 69 extend downwardly and through the lower surface of the unitary member for directing gases into a process region.

The two internal gas distribution networks are arranged at different elevations within the unitary member in such a manner so that the plenums, tributaries, inlet and outlet passages of one internal gas distribution network offset corresponding plenums, tributaries, inlet and outlet passages of another internal gas distribution network. In other words, the corresponding plenums, tributaries, and inlet and outlet passages are not overlapped when viewed from the top or bottom of the unitary member. When viewed from the bottom of the unitary member, the outlet passages of each of the internal gas distribution networks extend through the bottom surface in an alternative and even configuration.

In a further embodiment, three internal gas distribution networks are formed at different elevations within a unitary member to independently and separately supply three gases into a process region. Each of the three internal gas distribution networks is described above with reference to FIGS. 2–8. The three internal gas distribution networks are not in fluid communication within the unitary member. The configuration of the three internal gas distribution networks can be substantially the same. In one embodiment, each of the three internal gas distribution networks is divided into six regions by six main passages or plenums. The six plenums converge at a junction and extend radially and outwardly to the peripheral surface of the unitary member. A plurality of parallel branch passages or tributaries are formed in each of the six regions. The tributaries are coupled to the plenums and extend outwardly to the peripheral surface of the unitary member. The tributaries and the plenum connected therewith constitute an angle about 30 degrees. An inlet passage is formed and coupled to the junction of the plenums. The inlet passage extends upwardly and through the upper surface of the unitary member to couple to a gas source via a conduit. A plurality of vertical outlet passages are formed along the path of each of the tributaries. The outlet passages extend downwardly and through the lower surface of the unitary member for directing gases into a process region.

The three internal gas distribution networks are arranged at different elevations within the unitary member in such a manner so that the inlet and outlet passages of one internal gas distribution network offset the inlet and outlet passages of the other two internal gas distribution network. In other words, the corresponding inlet and out passages are not overlapped when viewed from the top or bottom of the unitary member.

As described above, a gas distribution apparatus has been provided by the present invention. The foregoing description of specific embodiments of the invention have been presented for the purpose of illustration and description. They are not intended to be exhaustive or to limit the invention to the precise forms disclosed, and obviously many modification, embodiments, and variations are possible in light of the above teaching. It is intended that the scope of the invention be defined by the claims appended hereto and their equivalents.

We claim:

1. A gas distribution apparatus, comprising: a member having an upper surface, a lower surface and a periphery surface; and a gas distribution network formed within said member for uniformly delivering a gas into a process region, said gas distribution network being formed of: an inlet passage extending upwardly through said upper surface for connecting to a gas source; a plurality of first passages converged at a junction and connected with said inlet passage at the junction, said first passages extend radially and outwardly from the junction to the periphery surface; a plurality of second passages connected with said plurality of first passages, said plurality of first and second passages are coplanar, said second passages are non-perpendicular to said first passage and extend outwardly from said first passages to the periphery surface; and a plurality of outlet passages connected with said plurality of second passages and extending downwardly through said lower surface for delivering the gas into the processing region.

2. The apparatus of claim 1 wherein said member is cylindrical unitary member.

3. The apparatus of claim 1 wherein said plurality of second passages between adjacent two passages are in parallel.

4. The apparatus of claim 1 wherein said second passages are angled from the first passages connected therewith from about 30 to about 45 degrees.

5. The apparatus of claim 4 wherein said second passages are angled from the first passages in about 45 degree.

6. The apparatus of claim 1 wherein said second passages connected on both sides of a common first passage are staggeredly arranged.

7. The apparatus of claim 1 wherein said first passages are comprised of four orthogonal coordinate passages.

8. The apparatus of claim 1 wherein said first passages are comprised of six passages and adjacent two passages form an angle of about 60 degrees.

9. The apparatus of claim 1 wherein the first passages have a first diameter, the second passages have a second diameter, and the outlet passages have an outlet diameter, where the first diameter is larger than the second diameter, and the second diameter is larger than the outlet diameter.

10. The apparatus of claim 9 wherein the first diameter is selected in the range from about 5 to about 15 mm, the second diameter in the range from about 3 to about 12 mm, and the outlet diameter in the range from about 0.25 to about 2.5 mm.

11. The apparatus of claim 1 wherein the outlet passages have a substantially constant density on the lower surface of the unitary member.

12. The apparatus of claim 1 wherein the outlet passages are substantially cylindrical.

13. The apparatus of claim 1 wherein the outlet passages are formed of a first portion having a smaller diameter and a second portion having a greater diameter.

14. The apparatus of claim 1 wherein the outlet passages is provided with threading for receiving inserts to alter the size of and/or the direction of the gas exiting the outlet passages.

15. A gas distribution system, comprising: a unitary cylindrical member having an upper surface, a lower surface and a periphery surface; and two independent gas distribution networks formed within the unitary member, each of the gas distribution networks being formed of: an inlet passage extending upwardly through said upper surface for connecting to a gas a plurality of co-planar first passages converged at a junction and connected with said inlet passage at the junction, said first passages extend radially and outwardly from the junction to the periphery surface; a plurality of second passages connected with said plurality of first passages, said second passages are co-planar with and non-perpendicular to said first passages and extend outwardly from said first passages to the periphery surface; and a plurality of outlet passages connected with said plurality of second passages and extending downwardly through said lower surface for delivering the gas into the processing region, wherein said first and second passages of each of the gas distribution networks are formed at different elevations, and said two independent gas distribution networks are not in fluid communication within the unitary member.

16. The apparatus of claim 15 wherein the first passages of each of the gas distribution networks are comprised of four orthogonal coordinate passages.

17. The apparatus of claim 15 wherein the outlet passages of each of the two gas distribution networks extend through the lower surface in an alternate and even configuration.

18. The apparatus of claim 15 wherein the two gas distribution networks have substantially same dimensions and configurations.

19. A gas distribution system, comprising: a unitary cylindrical member having an upper surface, a lower surface and a periphery surface; and three independent gas distribution networks formed within the unitary member, each of the gas distribution networks being formed of: an inlet passage extending upwardly through said upper surface for connecting to a gas source; a plurality of coplanar gas passages converged at a junction and connected with said inlet passage at the junction, said gas passages extend radially and outwardly from the junction to the periphery surface; a plurality of second passages connected with said plurality of first passages, said second passages are co-planar with and non-perpendicular to said first passages and extend outwardly from said first passages to the periphery surface; and a plurality of outlet passages connected with said plurality of second passages and extending downwardly through said lower surface for delivering the gas into the processing region, wherein said first and second passages of each of the three gas distribution networks are formed at different elevations, and said three independent gas distribution networks are not in fluid communication within the unitary member.

20. The apparatus of claim 19 wherein the first passages of each of the three gas distribution networks are comprised of six passages, and adjacent two passages form an angle of about 60 degrees.

21. The apparatus of claim 19 wherein the three gas distribution networks have substantially same dimensions and configurations.

* * * * *

UNITED STATES PATENT AND TRADEMARK OFFICE
CERTIFICATE OF CORRECTION

PATENT NO. : 6,921,437 B1 Page 1 of 1
APPLICATION NO. : 10/854869
DATED : July 26, 2005
INVENTOR(S) : Jay Dedontney et al.

It is certified that error appears in the above-identified patent and that said Letters Patent is hereby corrected as shown below:

On the Title page, at Item (75) Inventors: Robert Jeffrey Bailey, Scotts Valley, CA, should be added Signed and Sealed this Twenty-third Day of September, 2008

JON W. DUDAS
*Director of the United States Patent and Trademark Office*